(12) United States Patent
Maejima

(10) Patent No.: US 6,542,033 B2
(45) Date of Patent: Apr. 1, 2003

(54) DIFFERENTIAL AMPLIFIER CIRCUIT REQUIRING SMALL AMOUNT OF BIAS CURRENT IN A NON-SIGNAL MODE

(75) Inventor: Toshio Maejima, Iwata (JP)

(73) Assignee: Yamaha Corporation, Hamamatsu (JP)

( * ) Notice: Subject to any disclaimer, the term of this patent is extended or adjusted under 35 U.S.C. 154(b) by 0 days.

(21) Appl. No.: 10/148,537

(22) PCT Filed: Dec. 1, 2000

(86) PCT No.: PCT/JP00/08512
§ 371 (c)(1),
(2), (4) Date: May 31, 2002

(87) PCT Pub. No.: WO01/41301
PCT Pub. Date: Jun. 7, 2001

(65) Prior Publication Data
US 2002/0180529 A1 Dec. 5, 2002

(30) Foreign Application Priority Data

Dec. 2, 1999 (JP) .......................................... 11/343947

(51) Int. Cl.[7] ................................................ H03F 3/45
(52) U.S. Cl. ........................ 330/261; 330/253; 330/259
(58) Field of Search ................................ 330/253, 259, 330/261

(56) References Cited

U.S. PATENT DOCUMENTS 4,333,059 A * 6/1982 Yamaguchi et al. ........ 330/265
5,055,797 A * 10/1991 Chater ........................ 330/268
5,467,058 A * 11/1995 Fujita .......................... 330/267
5,917,378 A    6/1999 Juang

FOREIGN PATENT DOCUMENTS

| TW | 351857 | 4/1986 |
|----|--------|--------|
| TW | 089125620 | 2/2002 |

* cited by examiner

*Primary Examiner*—Robert Pascal
*Assistant Examiner*—Patricia Nguyen
(74) *Attorney, Agent, or Firm*—Pillsbury Winthrop LLP

(57) ABSTRACT

A differential amplifier circuit of the present invention comprises an input circuit 10 for producing a difference voltage signal between a positive input signal and a negative input signal, a feedback bias circuit 20 for inputting the difference voltage signal supplied from the input circuit 10 to provide a bias voltage corresponding to the difference voltage signal and for performing a feedback control on the bias voltage by feeding back an output current, an output circuit 30 for supplying a load with the output current corresponding to the bias voltage, and a current detection circuit 40 for detecting the output current to provide it to the feedback bias circuit 20. The differential amplifier circuit performs class-AB amplification in such a way that the bias voltage provides a current value close to zero when the difference voltage signal is substantially zero.

4 Claims, 4 Drawing Sheets

DIFFERENTIAL AMPLIFIER CIRCUIT REQUIRING SMALL AMOUNT OF BIAS CURRENT IN A NON-SIGNAL MODE

This application is the National Phase of International Application PCT/JP00/08512 filed Dec. 1, 2000 which designated the U.S.

TECHNICAL FIELD

The present invention relates to push-pull amplifier circuits that comprise CMOS transistors and perform class-AB operations. The device of the present invention relates to differential amplifier circuits that are suitable for use in power conservation type devices such as portable telephones, which should secure the prescribed service life for batteries.

BACKGROUND ART

Conventionally, push-pull amplifier circuits comprising CMOS transistors have been widely used. FIG. 4 is a circuit diagram of a conventional device. In this figure, an input circuit 1 provides transistors T2 and T5 for constituting a current mirror circuit, a transistor T6 whose gate terminal inputs a positive input signal +IN, and a transistor T3 whose gate terminal inputs a negative input signal −IN. The current mirror circuit is connected with a positive voltage source $V_{DD}$. A bias circuit 2 comprises a resistor R1 for setting an operation bias point, and a transistor Ti for generating bias voltage, wherein it is inserted between the positive voltage source $V_{DD}$ and reference voltage $V_{SS}$. A transistor T4 is an element that supplies a bias current to the input circuit 1. A level shift circuit 3 comprises transistors T9 and T10. An output circuit 4 comprises output transistors T7 and T8 as well as an output terminal OUT.

In the device having the aforementioned configuration, the voltage that is calculated by subtracting voltage drop of the transistor T1 from the difference voltage between the positive voltage source $V_{DD}$ and reference voltage $V_{SS}$ is applied to the resistor R1 in the bias circuit 2, so that an electric current is forced to flow into a series circuit in which the resistor R1 and the transistor T1 are connected to an NB node. The magnitude of this current is supplied as the form of bias voltage to each element via the NB node, thus determining an operation point for each element. In the input circuit 1, the transistors T3 and T6 are identical to each other in characteristics, and the transistors T2 and T5 are identical to each other in characteristics. An N3 node is a common connection point between the transistors T5 and T6, so that an N3 node voltage $V_{N3}$ may greatly vary in response to variations of the difference voltage ($V_{+IN}-V_{-IN}$) between the positive input signal voltage $V_{+IN}$ and negative input signal voltage $V_{-IN}$. That is, the voltage gain is increased by using the negative resistance, which is established by drain currents $I_D$ and drain-source voltages $V_{DS}$ of the transistors T5 and T6, as an active load.

The output circuit 4 is an active load in which the output transistor T8 acts as a load for the output transistor T7, wherein a signal is applied through the transistor T9 to the output transistor T8 to operate. The current of the output transistor T7 varies in response to the N3 node voltage $V_{N3}$. A capacitor Cc is reduced in gain due to high frequencies to avoid oscillation. Variations of this current is converted to a signal having a large amplitude by the active load, so that the signal is output from the output terminal OUT. The level shift circuit 3 converts the difference voltage ($V_{+IN}-V_{-IN}$), supplied from the input circuit 1, in voltage level and supplies it to the output circuit 4.

In order to perform a class-A operation ensuring linear signal amplification, bias currents are normally forced to flow, regardless of the existence of the input signal. On the other hand, in the case of the high power amplifier circuit that performs a class-B operation, the bias voltage is set to zero so as to avoid the bias current flowing in a non-signal mode. However, the class-B operation may cause the crossover distortion due to the non-linearity of the characteristic in proximity to zero current. Therefore, in order to avoid occurrence of the crossover distortion, a class-AB operation is used to allow a small bias current to flow.

However, the conventional technology has a problem in that characteristic variations may easily occur because the operation point of the output circuit would vary due to manufacture differences and power variations. Therefore, a small bias current is forced to flow in a non-signal mode in order to secure some margins. It is required that portable telephones should secure one-hundred hours or more per a single battery with respect to the reception wait time; hence, the bias current should be extremely reduced in a non-signal mode. The present invention is provided to solve the aforementioned problems. It is an object of the invention to provide a differential amplifier circuit in which the operation point of the output circuit is stable, and which requires an extremely small amount of bias current compared to the maximal output current in a non-signal mode.

DISCLOSURE OF INVENTION

A differential amplifier circuit of the present invention solving the aforementioned problems comprises as shown in FIG. 1 an input circuit 10 for producing a difference voltage signal between the positive input signal and negative input signal, a feedback bias circuit 20 that inputs the difference voltage signal supplied from the input circuit 10 to provide a bias voltage corresponding to the difference voltage signal and that performs feedback controls on the bias voltage by feeding back an output current, an output circuit 30 for supplying the load with the output current corresponding to the bias voltage, and a current detection circuit 40 that detects the output current to provide it to the feedback bias circuit 20, wherein class-AB amplification is performed in such a way that the bias voltage has a current value close to zero when the difference voltage signal is substantially zero.

In the device having the aforementioned configuration, class-AB amplification is performed in such a way that when no signal is applied to the input circuit 10, the feedback bias circuit 20 supplies the output circuit with the bias voltage whose current consumed is small compared to the maximal output current. The current detection circuit 40 detects the output current to feed back it to the feedback bias circuit 20, which in turn performs feedback controls on the bias voltage by feeding back the output current. Therefore, even though manufacture differences and power variations exist, it is possible to obtain a differential amplifier circuit in which the operation point of the output circuit is stable.

Preferably, the input circuit 10 comprises a first transistor MP2 whose gate terminal inputs a positive input signal, and a second transistor MP1 whose gate terminal inputs a negative input signal, wherein source terminals of the first and second transistors are connected to a positive voltage source $V_{DD}$ via a constant current source transistor MP3, and their drain terminals are connected to the aforementioned feedback bias circuit. Both the first and second transistors are identical to each other in characteristics; thus, it is possible to produce an accurate difference voltage signal.

Preferably, the output circuit 30 comprises a first output transistor MP17 and a second output transistor MN11 that are connected between the positive voltage source $V_{DD}$ and reference voltage GND, $V_{SS}$, wherein the bias voltage supplied from the feedback bias circuit 20 is applied to source terminals of the first and second output transistors, and the first and second output transistors are commonly connected to an output terminal. Due to an active load effect of the first and second output transistors, small variations of the bias voltage are converted into a signal having a large amplitude, which is output from the output terminal.

Preferably, the current detection circuit 40 comprises a first current detection transistor MP16 in which the bias voltage applied to the first output transistor MP17 is supplied to the gate terminal, and the voltage of the positive voltage source $V_{DD}$ is supplied to the source terminal, and a second current detection transistor MN10 in which the bias voltage applied to the second output transistor MN11 is supplied to the gate terminal, and the reference voltage GND, $V_{SS}$ is supplied to the source terminal. Thus, it is suitable for realizing the output current of the output circuit 30 being fed back to the feedback bias circuit 20. In addition, it is possible to constitute the current detection circuit 40 comprising a current control transistor MP12 in which the bias current applied to the first output transistor MP17 is supplied to the gate terminal, and the voltage of the positive voltage source $V_{DD}$ is supplied to the source terminal, and a third current detection transistor MN23 in which the bias voltage applied to the second output transistor MN11 is supplied to the gate terminal, and the reference voltage GND, $V_{SS}$ is supplied to the source terminal. Thus, it is possible to simplify the circuit configuration compared to the configuration defined in claim 4.

BEST MODE FOR CARRYING OUT THE INVENTION

Hereinafter, embodiments of the present invention will be described with reference to the drawings.

Figure 1:
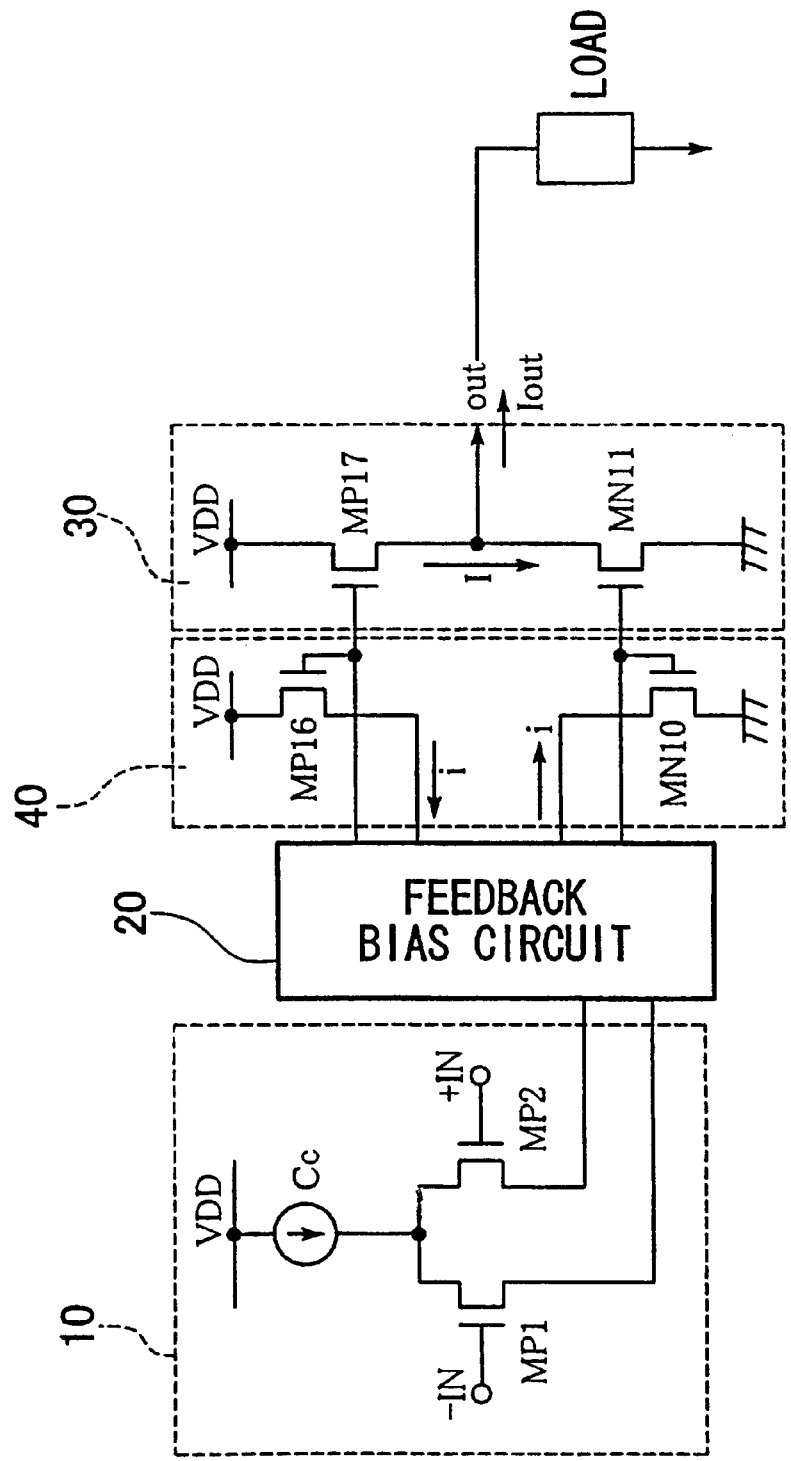
FIG. 1 is a block diagram for explaining one embodiment of the present invention.

FIG. 1 is a block diagram for explaining one embodiment of the present invention. In this figure, an input circuit 10 comprises a p-channel transistor MP1 whose gate terminal inputs a negative input signal –IN, and a p-channel transistor MP2 whose gate terminal inputs a positive input signal +IN. Source terminals of the transistors MP1 and MP2 are both connected with a positive voltage source $V_{DD}$ via a constant current source, and their drain terminals are connected to a feedback bias circuit 20.

The feedback bias circuit 20 supplies an output circuit 30 with a control signal corresponding to the difference voltage between the positive input signal +IN and negative input signal –IN supplied to the input circuit 10. In addition, it performs feedback controls using current detection signals fed back thereto from a current detection circuit 40. The current detection circuit 40 comprises a currrent detection p-channel transistor MP16 and a current detection n-channel transistor MN10. The gate terminal of the current detection p-channel transistor MP16 is connected to a control output voltage terminal of the feedback bias circuit 20 for supplying control output voltage to the p-channel output transistor MP17, wherein its drain terminal is connected to a feedback terminal of the feedback bias circuit 20. The gate terminal of the current detection output n-channel transistor MN10 is connected to a control output voltage terminal of the feedback bias circuit 20 for supplying control output voltage to the n-channel output transistor MN11, wherein its source terminal is connected to the feedback bias circuit 20, and its drain terminal is grounded.

The output circuit 30 comprises a p-channel output transistor MPN7 and an n-channel output transistor MN11. The gate terminal of the p-channel output transistor MP17 is connected to the control output voltage terminal of the feedback bias circuit 20, wherein its source terminal is connected to the positive voltage source $V_{DD}$, and its drain terminal is connected to a load output terminal 'out'. The gate terminal of the n-channel output transistor MN11 is connected to the control output voltage terminal of the feedback bias circuit 20, wherein its source terminal is connected to the load output terminal 'out', and its drain terminal is grounded.

Next, the device having the aforementioned configuration will be described. When no differential input comes from the input circuit 10, an output current of the feedback bias circuit 20 (i.e., a detection current of the current detection circuit 40) is designated by 'i', by which a current I is forced to flow in the output circuit 30. It does not matter how much current I flows in the output circuit 30. The current I should be small because it is unwanted in the condition where no output current $I_{out}$ is provided.

Therefore, the current detection circuit 40 detects the current by the current mirror operation; then, the feedback bias circuit 20 performs prescribed controls in such a way that the detected current would constantly have a certain value. In response to the polarity of the differential input current from the input circuit 10 whether to be positive or negative, the control output voltage of the feedback bias circuit 20, that is, the gate voltage of the output transistor is converted to the voltage output having the same sign of its input current, by which the load connected to the output circuit 30 is driven.

While the output circuit 30 makes the current to flow into the load, current $I+I_{out}$ flows through the p-channel output transistor MP17, so that the current detection p-channel transistor MP16 will detect a relatively large current. At this time, the current I flows through the n-channel output transistor MN11, so that the current detection n-channel transistor MN10 will detect a certain current corresponding to the current I. The feedback bias circuit 20 selectively outputs smaller one of the detection currents of the current detection p-channel transistor MP16 and current detection n-channel transistor MN10, so that the feedback bias circuit 20 operates to control it not to reduce the output current $I_{out}$.

Figure 2:
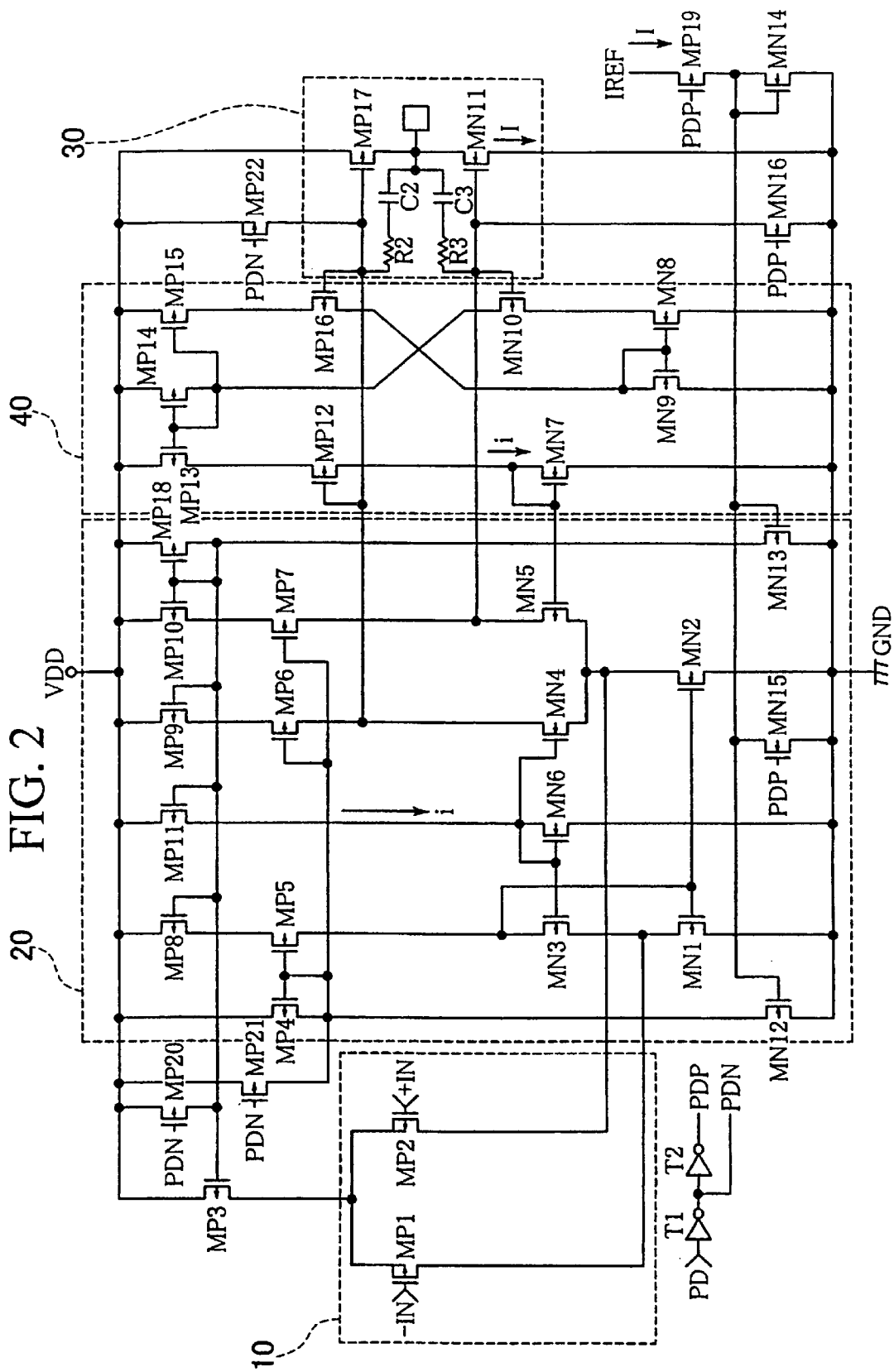
FIG. 2 is a circuit diagram for explaining a first embodiment of the present invention.

Next, the concrete circuitry for embodying the present invention will be described. FIG. 2 is a circuit diagram for explaining a first embodiment of the present invention. Herein, an input circuit 10 comprises a p-channel transistor MP1 whose gate terminal inputs a negative input signal –IN, and a p-channel transistor MP2 whose gate terminal inputs a positive input signal +IN. Source terminals of the transistors MP1 and MP2 are both connected to a positive voltage source $V_{DD}$ via a transistor MP3. The transistor MP3 is turned on or off by a transistor MP20 that is turned on or off in response to a power-down signal PDN, so that on/off controls of the differential amplifier circuit are synchronized with the power-down signal PDN. Incidentally, the power-down signal PDN is supplied from the power switch installed in the differential amplifier circuit, which may provide positive-phase PDN and negative-phase PDN in response to the polarity of the transistor(s).

A feedback bias circuit 20 provides transistors MP8, MP9, MP10, MP11, and MP18 that are respectively turned on or off in synchronization with the transistor MP3. In addition, the power-down signal PDN is supplied to the gate terminal of a transistor MP21 as well. Hence, transistors MP4, MP5, MP6, and MP7 are respectively turned on or off in synchronization with the transistor MP21. The power-down signal PDN is supplied to the gate terminal of a transistor MN15; hence, transistors MN12, MN13, and MN14 are respectively turned on or off in synchronization with the transistor MN15. The power-down signal PDN is supplied to the gate terminal of a transistor MP19, which in turn performs on/off controls whether to apply a current reference signal $I_{ref}$ to the gate terminal of the transistor MN12. The transistors MN13, MN14, and MN15 constitute a current mirror circuit.

Pairs of transistors MP5 and MP8, MP6 and MP9, and MP7 and MP10 are each connected together in a cascade-connection manner, so that each of them operate at lower voltage. The transistors MP6 and MP7 increase the output impedance of a folded cascade circuit. The drain terminal of the transistor MPN11 is connected to all the gate terminals of the transistors MN3, MN4, and MN6. Since the reference current i flows through the transistor MP11, it is subjected to current-voltage conversion by the transistor MN6, thus biasing the transistors MN3 and MN4. Therefore, the transistor MP11 and the transistors MN1 and AW2 are combined together to form a folded cascade circuit, by which the output impedance is increased to raise the gain.

The drain terminal of the transistor MN1 is connected to the drain terminal of the p-channel transistor MP1 and the source terminal of the transistor MN3, wherein its source terminal is grounded. The drain terminal of the transistor MN2 is connected to the drain terminal of the p-channel transistor MP2 and the source terminals of the transistors MN4 and MN5, wherein its source terminal is grounded. The gate terminals of the transistors MN1 and MN2 are connected to a common connection point between the drain terminal of the transistor MN3 and the drain terminal of the transistor MP5. The drain terminal of the transistor MN4 is connected to the drain terminal of the transistor MP6 and the gate terminal of the p-channel output transistor MP17. The drain terminal of the transistor MN5 is connected to the drain terminal of the transistor MP7 and the gate terminal of the n-channel output transistor MN11.

In the output circuit 30, a CR circuit consisting of a phase compensation resistor R2 and a capacitor C2 is provided between the drain and gate of the p-channel output transistor MP17. In addition, a CR circuit consisting of a phase compensation resistor R3 and a capacitor C3 is provided between the drain and gate of the n-channel output transistor MN11. The p-channel output transistor MP17 is turned on or off by the transistor MP22 that is turned on or off in response to the power-down signal PDN. The n-channel output transistor MN11 is turned on or off by the transistor MN16 that is turned on or off in response to the power-down signal PDN. The current detection circuit 40 has a current circuit comprising the transistors MP13, MP14, and MP15. The gate terminal of the current detection p-channel transistor MP16 is connected to the gate terminal of the p-channel output transistor MP17, wherein its source terminal is connected to the drain terminal of the transistor MP15, and its drain terminal is grounded via the transistor MN9. The gate terminal of the current detection n-channel transistor MN10 is connected to the gate terminal of the n-channel output transistor MN11, wherein its source terminal is connected to the drain terminal of the transistor MN8, and its drain terminal is connected to the positive voltage source $V_{DD}$ via the transistor MP14. The transistor MN7 detects the current flowing through the current mirror circuit by use of the transistor MP13. Further, it reflects the gate terminal voltage of the p-channel output transistor MP17 by the transistor MP12, so that the detected current is subjected to current-voltage conversion and is fed back to the gate terminal of the transistor MN5.

In the device having the aforementioned configuration, currents flowing through the transistors MN6 and MN7 are controlled to match their size ratios, wherein by reducing the current I of the output circuit to be small, it is possible to reduce the overall current consumed. By setting the current I of the output circuit to match one of several hundreds fractions of the maximal output current, it is possible to reduce the consumed current to be small in a non-signal mode.

Figure 3:
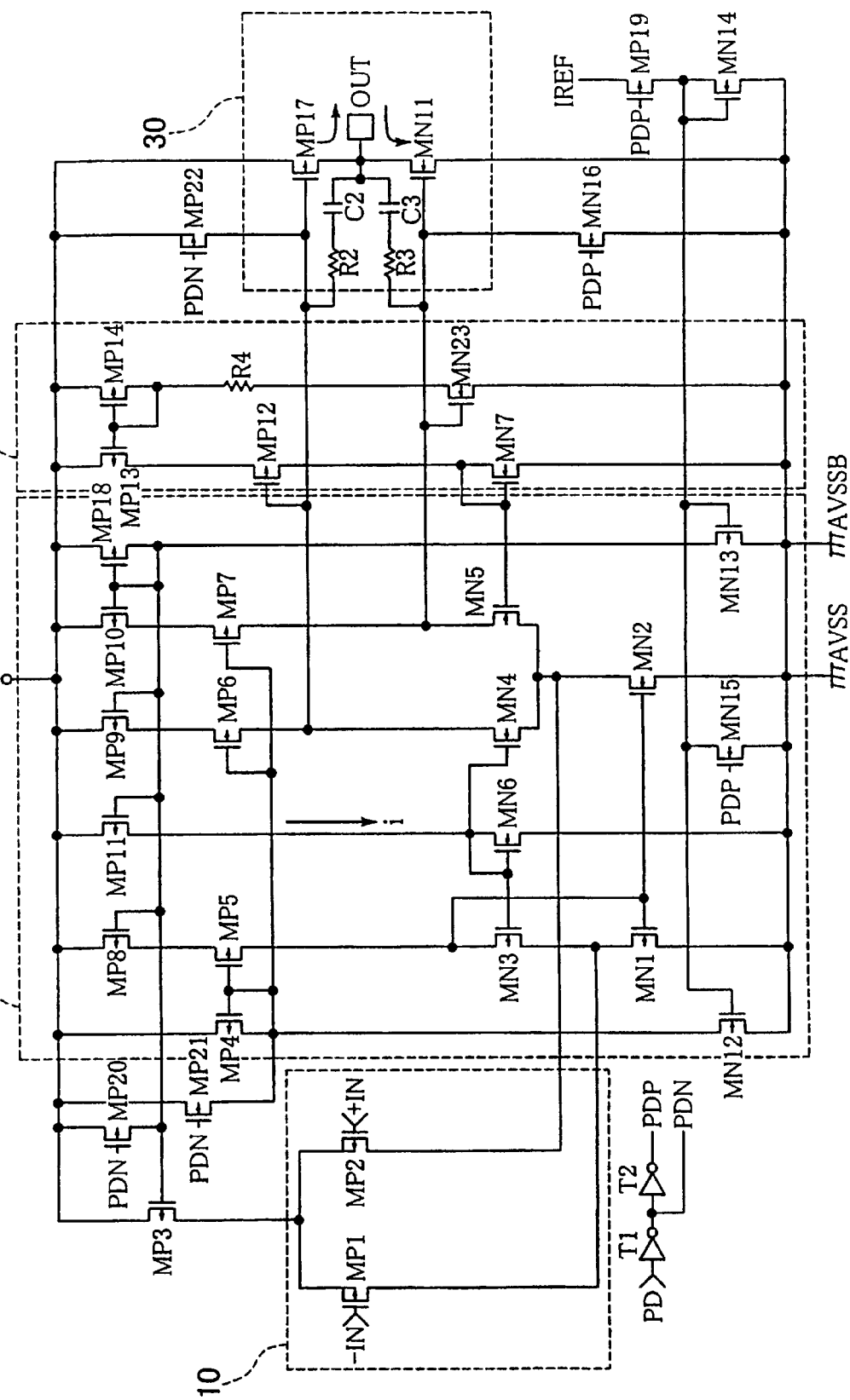
FIG. 3 is a circuit diagram for explaining a second embodiment of the present invention.
Figure 4:
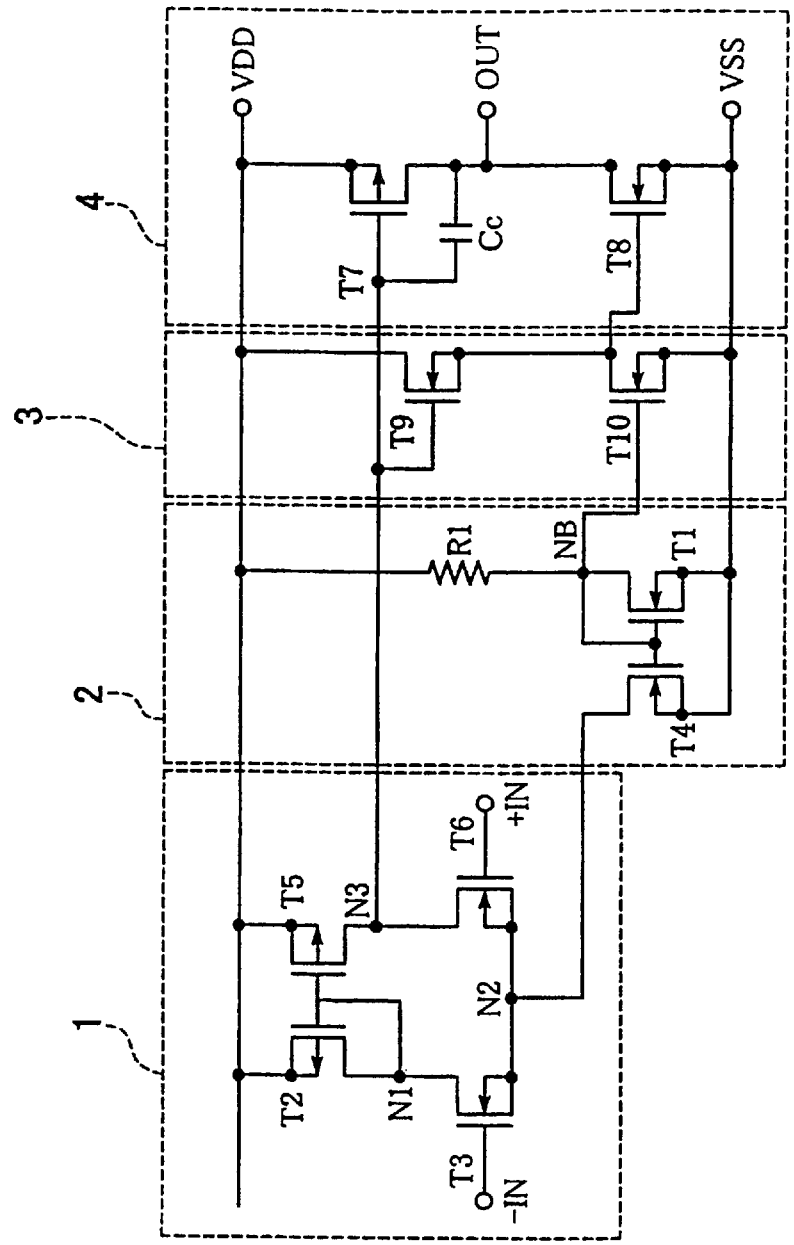
FIG. 4 is a circuit diagram of the conventional device.

FIG. 3 is a circuit diagram for explaining a second embodiment of the present invention. Compared to the first embodiment, the second embodiment is simplified in the current detection circuit 40. The current detection circuit 40 comprises transistors MP13 and MP14 constituting a current mirror circuit, a current limitation resistor R4, and a transistor MP12 as well as transistors MN7 and MN23. As to the current control transistor MP12, the bias voltage applied to the output transistor MP17 is supplied to the gate terminal, and the voltage of the positive voltage source $V_{DD}$ is supplied to the source terminal via the transistor MP13. As to the current detection transistor MN23, the bias voltage applied to the output transistor MN11 is supplied to the gate terminal, the source terminal is grounded, and the drain terminal is connected to the positive voltage source $V_{DD}$ via the resistor R4 and transistor MP14. It also provides a transistor MN7 similar to the first embodiment.

By the aforementioned circuit configuration, it is possible to provide a differential amplifier circuit in which the bias current in a non-signal mode is extremely small, and a large current can be produced in a large signal mode. The aforementioned embodiments use CMOS transistors for the feedback bias circuit and current detection circuit. However, the present invention is not necessarily limited to them. Hence, it is possible to use other forms of amplifier elements that enable power conservation operations and provide high amplification factors.

As described heretofore, the differential amplifier circuit of the present invention performs class-AB amplification by the feedback bias circuit supplying the output circuit with the bias voltage causing a small amount of consumed current compared to the maximal output current when substantially no signal is input to the input circuit. Hence, it is possible to extremely reduce the consumed current compared to the maximal output current in a non-signal mode. Therefore, the present invention can secure a longer service life for batteries and is particularly suitable for use in portable telephones and portable game devices. In addition, the present invention employs feedback controls in which the current detection circuit detects and feeds back the output current to the feedback bias circuit, which in turn feeds back the output current to control the bias voltage. Therefore, it is possible to obtain a differential amplifier circuit in which the operation point of the output circuit is stable, regardless of manufacture differences and power variations.

What is claimed is:

1. A differential amplifier circuit comprising:
   an input circuit for generating a difference voltage signal between a positive input signal and a negative input signal:
   a feedback bias circuit for producing a bias voltage in response to the difference voltage signal, and for performing a feedback control on the bias voltage by feeding back an output current;
   an output circuit, comprising a first output transistor (MP17) and a second output transistor (MN11) that are commonly connected to an output terminal, for producing the output current in response to the bias voltage and for outputting it to the output terminal; and
   a current detection circuit comprising a first current detection transistor (MP16), which is connected to the first output transistor commonly at a gate thereof to detect its current, and a second current detection transistor (MN10) which is connected to the second output transistor commonly at a gate thereof to detect its current,
   wherein the feedback bias circuit performs the feedback control by outputting smaller one of detection currents of the first current detection transistor and the second current detection transistor.

2. A differential amplifier circuit according to claim 1, wherein both the first output transistor and the first current detection transistor are constituted by p-channel transistors, and both the second output transistor and the second current detection transistor are constituted by n-channel transistors.

3. A differential amplifier circuit according to claim 1 or 2, wherein the feedback bias circuit contains a transistor (MN6) for conversion of its reference current, and the current detection circuit contains a transistor (MN7) for detection of the reference current, so that currents of these transistors are controlled to match their size ratios.

4. A differential amplifier circuit according to claim 1 or 2, wherein the feedback bias circuit contains a transistor (MN6) for conversion of its reference current, and the current detection circuit comprises a first current detection transistor (MP12), which is connected to the first output transistor commonly at a gate thereof to detect its current, a second current detection transistor (MN23), which is connected to the second output transistor commonly at a gate thereof to detect its current, and a transistor (MN7) for detecting the reference current of the feedback bias circuit.

* * * * *